US006937072B1

(12) United States Patent
Paulus et al.

(10) Patent No.: US 6,937,072 B1
(45) Date of Patent: Aug. 30, 2005

(54) DRIVER CIRCUIT AND METHOD FOR OPERATING A DRIVER CIRCUIT

(75) Inventors: Christian Paulus, Munich (DE); Ralf Klein, Munich (DE)

(73) Assignee: Infineon Technologies AG, (DE)

( * ) Notice: Subject to any disclaimer, the term of this patent is extended or adjusted under 35 U.S.C. 154(b) by 0 days.

(21) Appl. No.: 10/069,806

(22) PCT Filed: Aug. 23, 2000

(86) PCT No.: PCT/DE00/02875

§ 371 (c)(1),
(2), (4) Date: May 13, 2002

(87) PCT Pub. No.: WO01/15322

PCT Pub. Date: Mar. 1, 2001

(30) Foreign Application Priority Data

Aug. 25, 1999 (DE) .................................. 199 40 356

(51) Int. Cl.[7] .............................................. H03K 3/00
(52) U.S. Cl. .................... 327/108; 327/112; 327/110
(58) Field of Search ...................... 327/108, 112, 109, 327/110, 111; 326/82, 83, 84, 85, 86, 87, 326/88, 90, 108

(56) References Cited

U.S. PATENT DOCUMENTS

| 4,682,050 | A |   | 7/1987 | Beranger et al. | ............. | 326/26 |
| 5,523,864 | A | * | 6/1996 | Gaalema et al. | ............. | 349/33 |
| 5,537,067 | A |   | 7/1996 | Carvajah et al. | ............ | 326/108 |
| 5,808,481 | A |   | 9/1998 | Thompson | .................... | 326/83 |
| 5,872,473 | A |   | 2/1999 | Williams | ..................... | 327/108 |
| 5,973,512 | A |   | 10/1999 | Baker | .......................... | 326/87 |

(Continued)

FOREIGN PATENT DOCUMENTS

| DE | 3935452 A | 5/1991 |
| DE | 19916437 | 2/2000 |
| WO | WO 99 26340 | 5/1999 |

Primary Examiner—Tuan T. Lam
Assistant Examiner—Hiep Nguyen
(74) Attorney, Agent, or Firm—Altera Law Group, LLC; Jeffrey R. Stone

(57) ABSTRACT

The invention relates to a driver circuit (10) for integrated circuits comprising at least one input node (11) for an input signal and at least one output node (12) for an output signal. One or several, preferably two partial drivers (20, 30) supply approximately sine-wave shaped current to the load capacity (15) thereby improving electromagnetic compatibility. A feedback circuit (40) is also provided. Said feedback circuit consists of one or several evaluation circuits (50) and one or several feedback capacitors (41). The evaluation circuits (50) are connected to the partial drivers (20, 30) One feedback capacitor (41, 42) is respectively arranged between an output node (12) of the driver circuit (10) and an input node (51) of an evaluation circuit (50). An evaluation circuit (50) is provided via the feedback condenser (41, 42) between an output node (12) of the driver circuit and an input node (51). The edge steepness of the signal i.e. current which is independent of the actual load, can be produced by means of a feedback circuit (40). The feedback capacitor (41) can, for example, be embodied as a non-linear capacitor.

15 Claims, 5 Drawing Sheets

U.S. PATENT DOCUMENTS 6,137,322 A * 10/2000 Ten Eyck ................... 327/112
6,163,174 A * 12/2000 Friedman et al. ........... 326/108
6,329,846 B1 * 12/2001 Davies et al. ............... 326/121
6,445,253 B1 * 9/2002 Talbot ......................... 331/57
6,552,931 B2 * 4/2003 McPartland et al. ... 365/185.05
6,650,152 B2 * 11/2003 Kawabata ................... 327/112

* cited by examiner

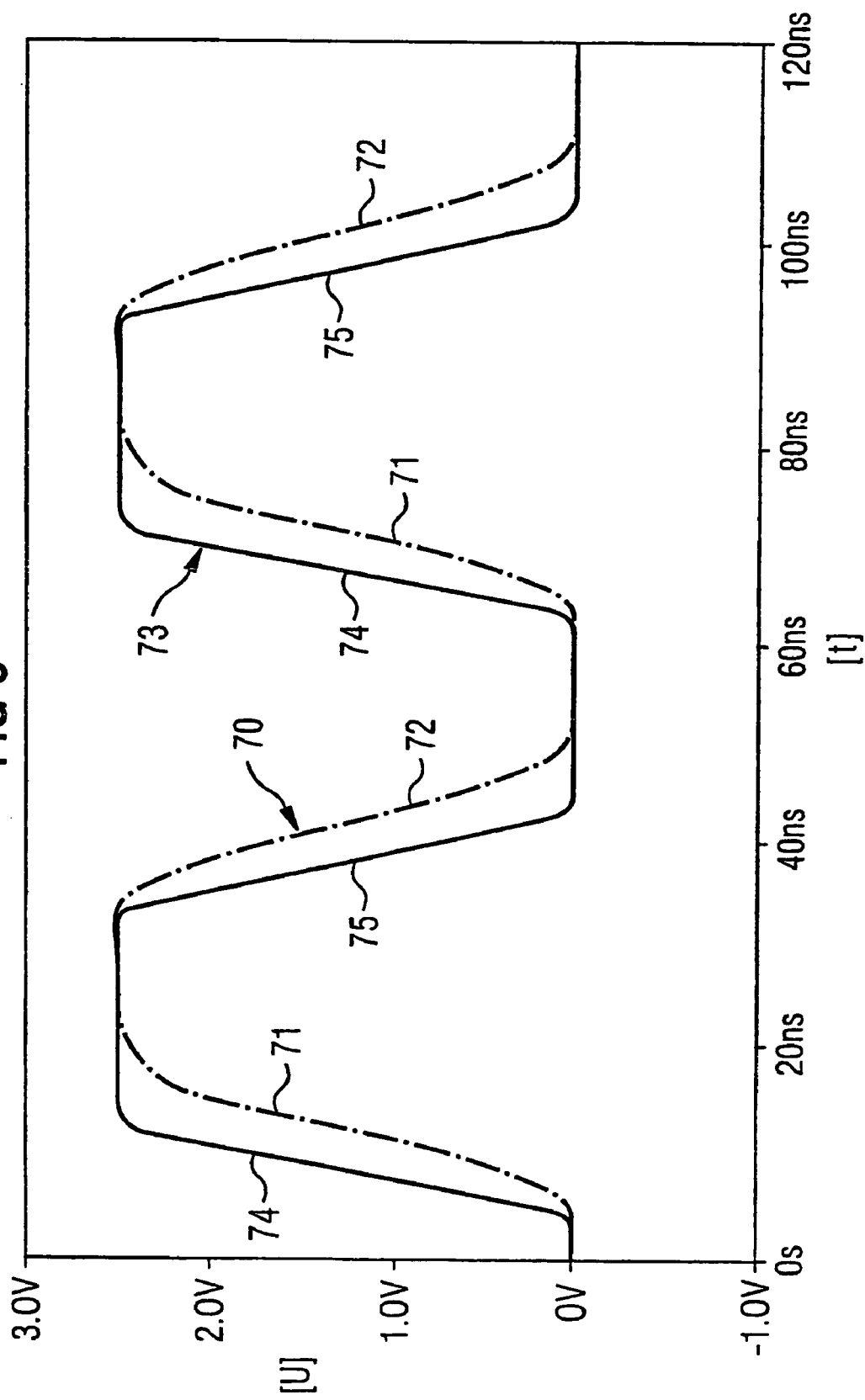

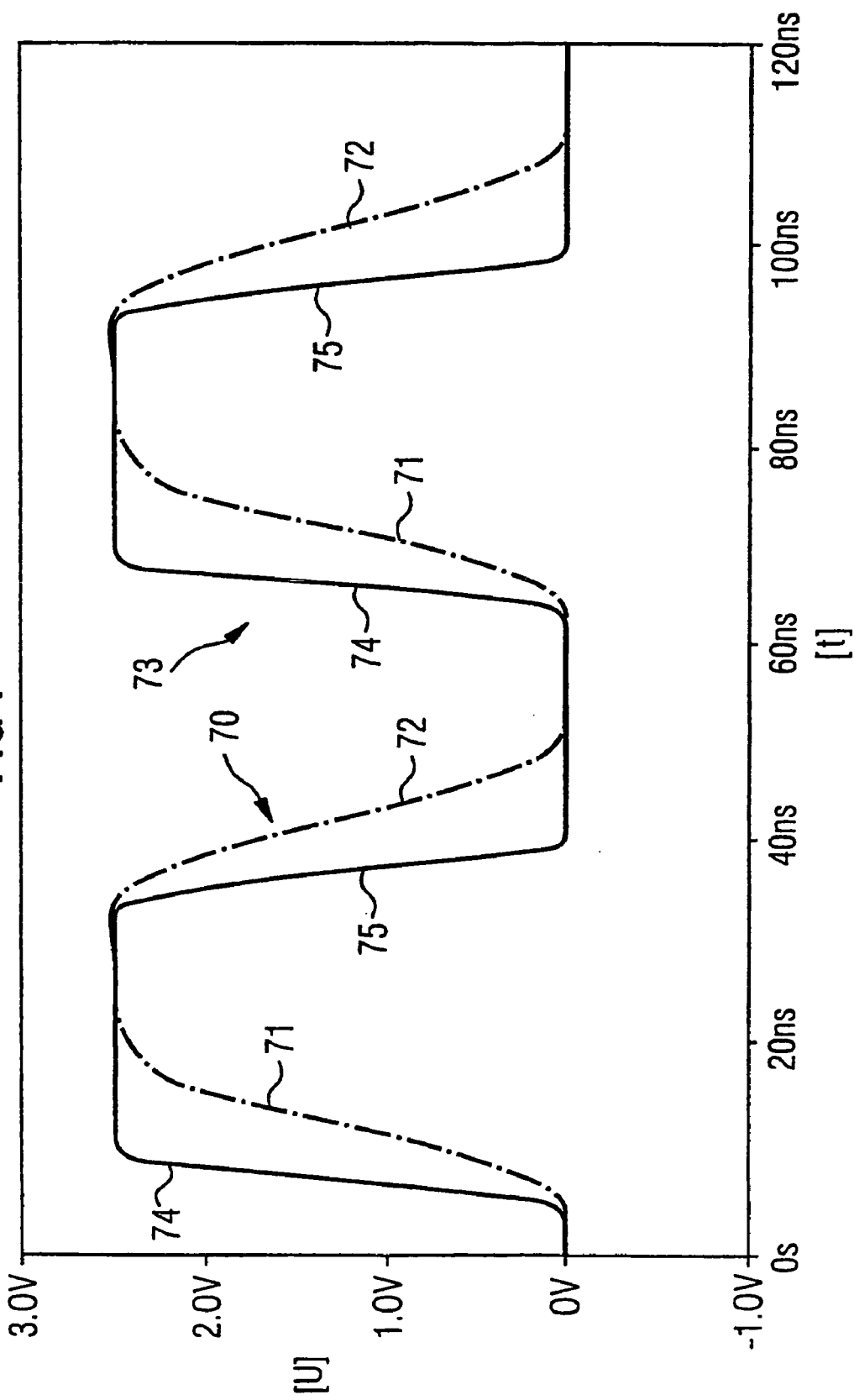

DRIVER CIRCUIT AND METHOD FOR OPERATING A DRIVER CIRCUIT

BACKGROUND OF INVENTION

1. Field of Invention

The present invention generally relates to a driver circuit and a method for operating such a driver circuit.

2. Description of Related Art

Driver circuits are used in diverse ways in integrated digital circuitry, for example as drivers for lines, busses of integrated circuits or the like.

In recent years, the requirements imposed on electronic components and thus also on the driver circuits, in particular in electronic systems clocked at high speed, have risen rapidly. One of these requirements that have risen relates for example to electromagnetic compatibility (EMC).

Integrated digital circuits are generally connected via conductive connections to peripheral devices, power sources and the like. This results, inter alia, in parasitic capacitances which lead to disadvantageous signal alterations. External loads, the parasitic capacitances and also the driver transistors themselves form an electronic network in which resonance effects, reflections and the like can occur. These generate transient signals which can deviate from their envisaged magnitude and shape and exceed or fall below their final voltage states. On account of the densely packed design on chips, such transient signals can adversely affect not only their own signal lines themselves but also signal lines of adjacent electronic components.

On account of the increasing requirements, there is a need to improve electronic components, corresponding driver circuits and the like, in such a way that these disadvantages can be avoided.

U.S. Pat. No. 5,537,067 describes, for example, a driver circuit which can be operated in order to regulate the rise times and fall times of signals supplied to a load. This driver circuit has a first inverter with a PMOS transistor and an NMOS transistor and a resistor. A second inverter has a PMOS transistor and an NMOS transistor. The resistor and additionally provided capacitors increase the transition times of the output driver signal in order to control the electromagnetic radiation caused by short transition times of the output signal.

SUMMARY OF INVENTION

It is an object of the present invention to provide an improved driver circuit and an improved method for operating a driver circuit with which, in particular, the electromagnetic compatibility of electronic components can be improved.

This object is achieved, in accordance with the first aspect of the invention, by means of a driver circuit in accordance with the independent patent claim 1. Advantageous developments of the driver circuit according to the invention emerge from the subclaims.

The invention provides a driver circuit, having at least one input node for an input signal and at least one output node for an output signal, having one or more, preferably two, sub-drivers and having a feedback circuit, which has one or more evaluation circuits and one or more feedback capacitors, the evaluation circuit(s) being connected to the sub-driver(s) and the feedback capacitor(s) respectively being provided between an output node of the driver circuit and an input node of an evaluation circuit.

Such a driver circuit enables the electromagnetic compatibility of electronic components, in particular of integrated circuits, to be greatly improved.

The basic concept of the driver circuit according to the invention is that firstly a signal with the least harmonics possible can be generated, which signal is supplied to a load. By way of example, the signal may be a current which can be supplied for example as charging/discharging current to a load capacitance during the switching edges. Since the interference spectrum of a driver circuit depends on the temporal profile of the current which charges the load capacitance, in particular a $sin^2$-shaped current, which has a favorable interference spectrum, is advantageous as low-harmonics current. The low-harmonics current is preferably generated in the at least one sub-driver. This will be explained in more detail in the further course of the description.

Usually, the rise times and fall times of a driver circuit—and thus also the temporal current profile—depend on the magnitude of the load or the load capacitance. In the case of small loads, in particular, a large interference potential is present, since an unregulated driver then reverses the charge of said loads too quickly.

Therefore, the intention is that the driver circuit can additionally set an edge steepness of the signal (output signal coupled out from the driver circuit) supplied to the load, which edge steepness is independent of the present load situation. The load-independent edge steepness is set by means of the feedback circuit, in which a present edge steepness is in each case measured and evaluated. On the basis of the evaluation results, it is possible to adapt the driver strength in the at least one sub-driver in real time. However, it is also possible for the driver strength to be adapted progressively or the like.

The present edge steepness of the output signal is measured by means of the at least one feedback capacitor. Here a displacement current is generated, which is coupled into the at least one evaluation circuit and evaluated there. The evaluation can be effected for example in such a way that the measured displacement current is compared with corresponding reference current values. Afterward, the evaluated results are forwarded as control signals to the at least one sub-driver, where the driver strength thereof can be correspondingly adapted or readjusted. What is achieved in this way is that the same displacement current always occurs in the feedback capacitor. Examples of the construction and the method of operation of the feedback circuit will be explained in more detail in the further course of the description.

The driver circuit according to the invention thus makes it possible to be able to measure the output characteristic of the driver circuit directly, to evaluate the measurement results and to be able to bring about an alteration and adaptation of the driver strength in a manner dependent on the evaluated results. This makes it possible to achieve rise times and fall times that are largely independent of the output load. This means, in particular, that even temporary interference, such as, for example, the in-antiphase switching of adjacent, capacitively coupled lines or the like, does not influence the edge steepness.

The driver circuit according to the invention does not require the magnitude of the load that is connected downstream to be known. All that is important is that the load is smaller than a maximum permissible load.

The driver circuit enables an input signal, for example a binary input signal, to be coupled into it via the at least one input node, the signal being converted in the driver circuit and being output to a load, for example a load capacitance, via the at least one output node.

The driver circuit has at least one sub-drive, which may be designed as a so-called pull-up driver (a driver for the positive edge) and/or as a pull-down driver (a driver for the negative edge).

The construction of a driver circuit according to the invention will now firstly be described below. However, it goes without saying here that the invention is not restricted to the examples mentioned.

The driver circuit may have one or more sub-drivers. The driver circuit may advantageously have two sub-drivers which may be designed for example as pull-up driver and as pull-down driver.

The at least one sub-driver is connected to at least one output node, which is likewise connected to a load. Via the output node, the at least one sub-driver is also connected to the at least one evaluation circuit of the feedback device. At least one feedback capacitor is provided in this connecting line.

Preferably, the at least one input node for the input signal may be connected to the at least one sub-driver. A signal can be coupled into the at least one sub-driver via this connection, on the basis of which signal it is possible to determine in the sub-driver whether the latter must be activated. The value for the magnitude of the value to be readjusted or changed for the driver strength is coupled into the sub-driver(s) via the connection between sub-driver and evaluation circuit.

Furthermore, the at least one input node for the input signal may be connected to the at least one evaluation circuit. Via this connection, it is possible, for example, for the feedback circuit to be temporarily shut down if no transients are to be expected. This leads to a reduction in the power loss.

In a further configuration, two or more sub-drivers and two or more evaluation circuits may be provided, each sub-driver being connected to an evaluation circuit.

In such a configuration, it is advantageous likewise for two or more feedback capacitors to be provided, each feedback capacitor being provided between an output node of the driver circuit and an input node of an evaluation circuit.

The at least one output node may advantageously be connected or be able to be connected to a load capacitance. The load capacitance may be, on the one hand, the capacitance of a load connected to the driver circuit, for example an electronic component. Furthermore, the term load capacitance may also encompass parasitic capacitances or the like which occur at the output of the driver circuit or in the connection of the driver circuit to the respective load.

The input node or nodes of the evaluation circuit(s) are preferably of low-impedance design. This ensures that, during a transient, a small displacement current can flow via the feedback capacitor, which is then coupled into the evaluation device. Said displacement current is measured and evaluated by the feedback circuit.

The at least one sub-driver may preferably have one or more transistors. In the simplest case, the sub-driver may have a single transistor. However, more complex configurations are also conceivable, so that the invention is not restricted to a specific number of transistors.

One of the transistors may be designed, for example, as the actual driver transistor. Furthermore, an additional transistor operating as current source may be provided. Another additional transistor functioning as switch may be provided, as required.

If the driver circuit has two sub-drivers which are designed in the manner mentioned above, it is possible to generate an essentially low-harmonics, in particular $\sin^2$-shaped current. This is done by way of the selection of a suitable dimensioning of the actual driver transistors and of the transistors functioning as current source. The embodiment of some of the transistors as current sources (pre-driver transistors) and the deliberate utilization of the parasitic gate-drain capacitances of the actual driver transistors enables the load current profile to be shaped within wide limits.

Preferably, in each case at least one control transistor may be provided in the at least one sub-driver, said transistor being respectively connected to an evaluation circuit. The signal which is measured by the feedback capacitor and evaluated in the evaluation circuit is coupled out as output signal from the evaluation circuit and serves for actuating the control transistor or transistors, which correspondingly alter(s), for example reduce(s), the strength of the transistor or transistors functioning as pre-driver.

In a further configuration, the at least one evaluation circuit may be designed as an amplifier circuit with one or more transistors. In the amplifier circuit, the displacement current coupled in via the input node is amplified in such a way that it can be used for actuating the at least one sub-driver, in particular the control transistor provided in the sub-driver. The amplifier comprises one or more transistors, the number of transistors being variable depending on the application and amplifier power.

The at least one feedback capacitor may advantageously be designed as a linear capacitor. However, it is also possible for the at least one feedback capacitor to be designed as a nonlinear capacitor.

In an advantageous configuration, the nonlinear capacitor is formed from at least one PMOS transistor and/or at least one NMOS transistor. In such a configuration, the capacitor may consist of, for example, in each case an NMOS transistor and a PMOS transistor, the two transistors being connected in parallel. However, other configurations are also conceivable, so that the invention is not restricted to the example described.

A nonlinear capacitor constructed from NMOS and PMOS transistors has a voltage-dependent capacitance, so that three voltage-dependent capacitance values can be realized given a corresponding choice of the lengths and widths Wp, Lp, Wn, Ln of the transistors. As a result, the output characteristic curve of the driver circuit can additionally be shaped in a targeted manner. In the evaluation circuit, the displacement current of the feedback capacitor is compared with a reference current. On the basis of the evaluation, the driver strength is set by means of a control signal, so that the same displacement current always occurs in the feedback capacitor. Accordingly, in the case of a nonlinear capacitor, the edge steepness is reduced for high capacitance values and increased for small capacitance values. What can thus be achieved is that, in a load capacitance, firstly a small current flows, then a larger current and then a smaller current again.

In accordance with the second aspect of the invention, a method for operating a driver circuit according to the invention as described above is provided, which, according to the invention, is characterized in that a low-harmonics current is generated in the driver circuit and supplied to a load, and in that an edge steepness that is independent of the present load situation is set in the driver circuit.

What is achieved by the method according to the invention is that the load is supplied, on the one hand, with a current or a signal with advantageous properties in respect of EMC. On the other hand, an edge steepness that is independent of the present load situation is also achieved, which significantly improves the EMC especially with a small load. With regard to the advantages, actions, effects and mode of operation of the method according to the invention, the above explanations concerning the driver circuit according to the invention are hereby likewise incorporated by reference in their entirety.

Preferred embodiments of the method emerge from the subclaims.

A $\sin^2$-shaped current may advantageously be supplied to the load.

In order to set the load-independent edge steepness, the output characteristic of the driver circuit may preferably be measured by the feedback circuit and evaluated therein, the driver strength of the at least one sub-driver being regulated on the basis of the evaluation results.

In this case, the present edge steepness may be measured by the at least one feedback capacitor and the measured value may be coupled into the at least one evaluation circuit and evaluated. In the evaluation circuit, an output signal is then generated which controls at least one control transistor provided for regulating the driver strength in the at least one sub-driver.

In a particularly advantageous use, the driver circuit according to the invention and/or the method according to the invention may be used for improving the electromagnetic compatibility of electronic components, in particular of integrated circuits.

The invention will now be explained in more detail using exemplary embodiments with reference to the accompanying drawing, in which

BRIEF DESCRIPTION OF DRAWINGS

FIG. 6 shows a diagram illustrating the voltage profile of a driver circuit with feedback circuit in the case of a high and a small load; and FIG. 7 shows a diagram illustrating the voltage profile of a driver circuit without a feedback circuit in the case of a high and a small load.

DESCRIPTION OF THE INVENTION

Figure 1:
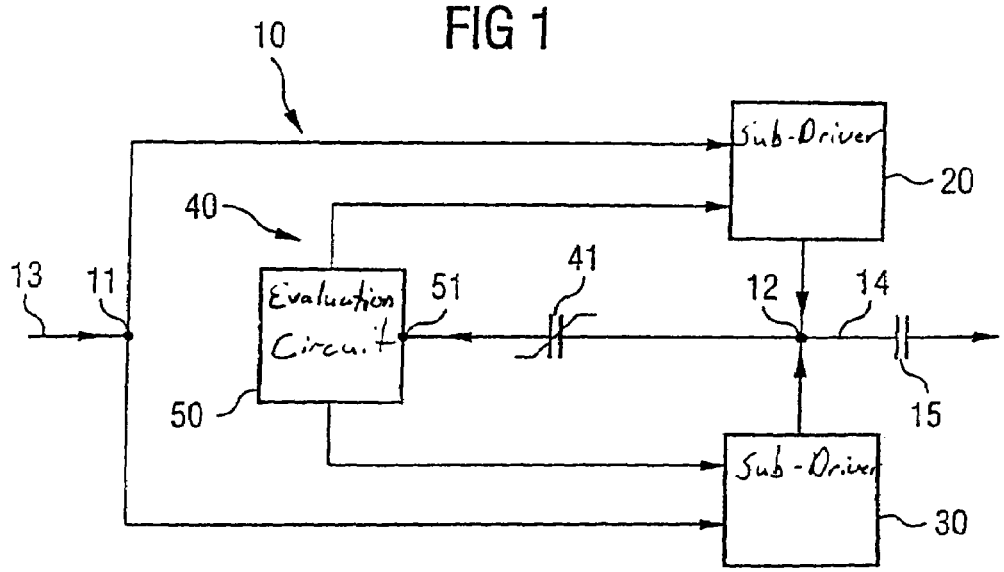
FIG. 1 shows a schematic view of a first embodiment of the driver circuit according to the invention.
Figure 2:
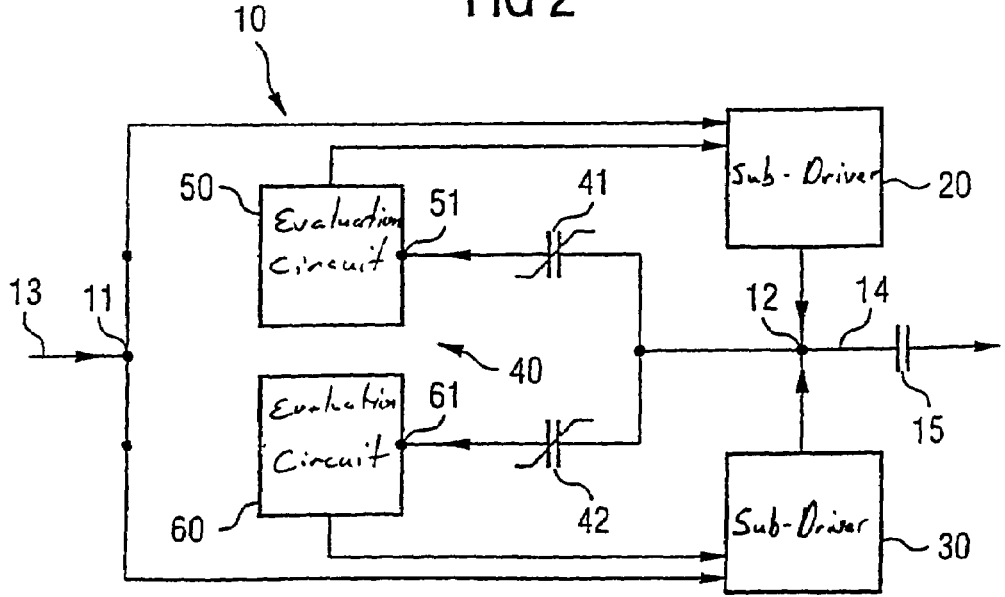
FIG. 2 shows a schematic view of a second embodiment of the driver circuit according to the invention.
Figure 3:
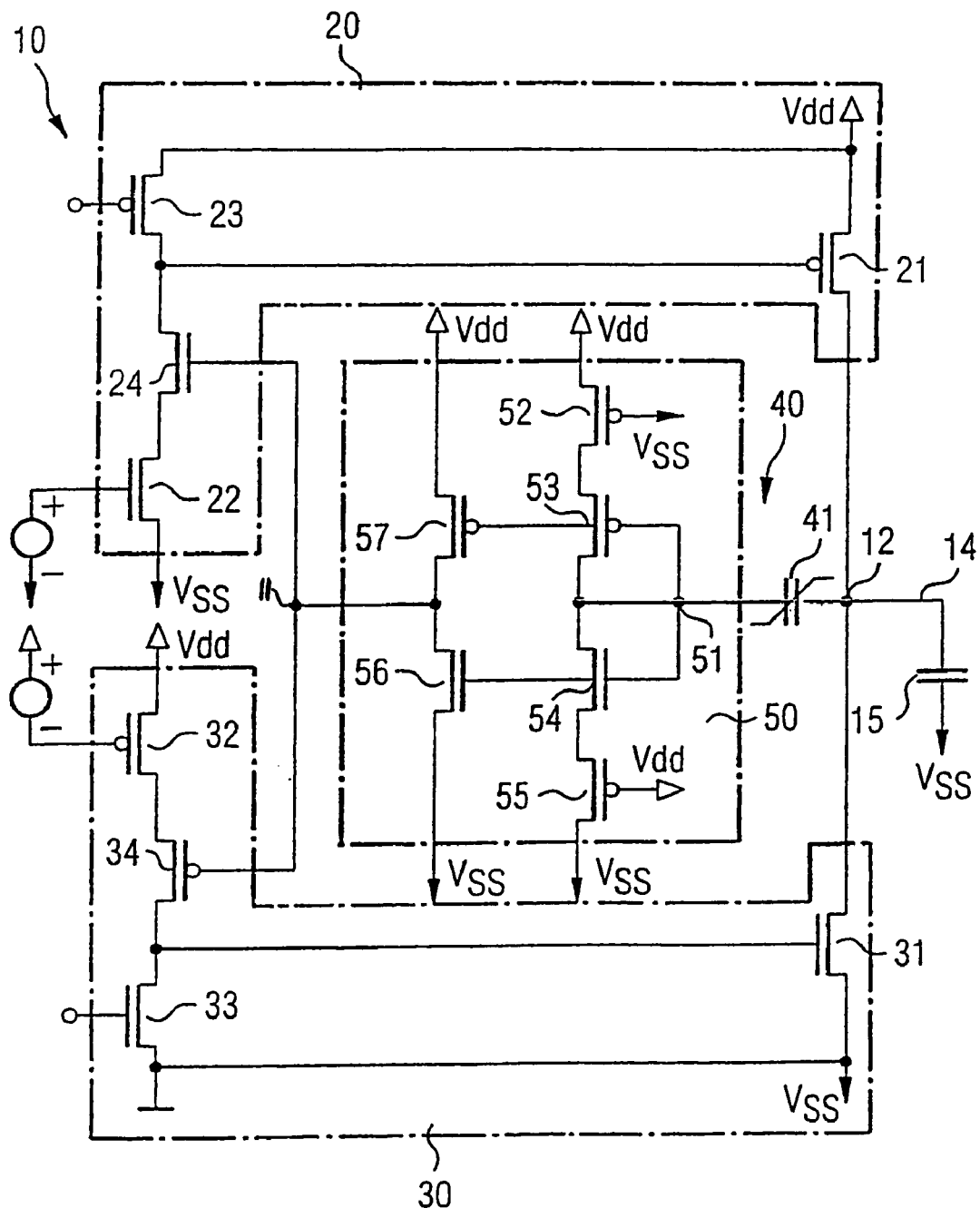
FIG. 3 shows a circuit diagram of the driver circuit in accordance with FIG. 1.

Firstly, FIGS. 1 and 2 illustrate two different embodiments of a driver circuit 10 according to the invention in a general configuration, while FIG. 3 illustrates a detailed circuit diagram of a driver circuit 10 in accordance with FIG. 1, in which the individual components are desiqned in a specified manner.

The driver circuit 10 is used in digital CMOS circuitry for lines, busses or the like.

The driver circuit 10 in accordance with FIG. 1 has an input node 11, into which an input signal 13, for example a binary signal, is coupled. In the driver circuit 10, the input signal 13 is converted and coupled out as output signal 14 via an output node 12 and is made available to a load, a load capacitance 15 in the present case.

The driver circuit 10 has two sub-drivers 20, 30, namely a pull-up driver 20 and a pull-down driver 30. The two sub-drivers 20, 30 are connected to the input node 11.

Furthermore, a feedback circuit 40 is provided, which constitutes an evaluation circuit 50 and a feedback capacitor 41.

Figure 4:
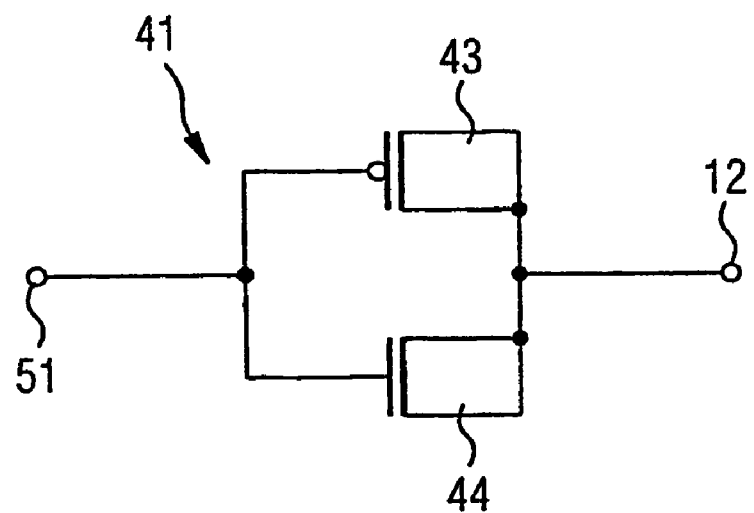
FIG. 4 shows an equivalent circuit diagram of a feedback capacitor.

As revealed by FIG. 4, the feedback capacitor 41 is designed as a nonlinear capacitor having a PMOS transistor 43 and an NMOS transistor 44 connected in parallel therewith. However, the feedback capacitor 41 may also be designed as a linear capacitor or as a nonlinear capacitor with a different configuration. The feedback capacitor 41 is connected to an input node 51 of the evaluation circuit 50 and the output node 12 of the driver circuit 10.

Figure 5:
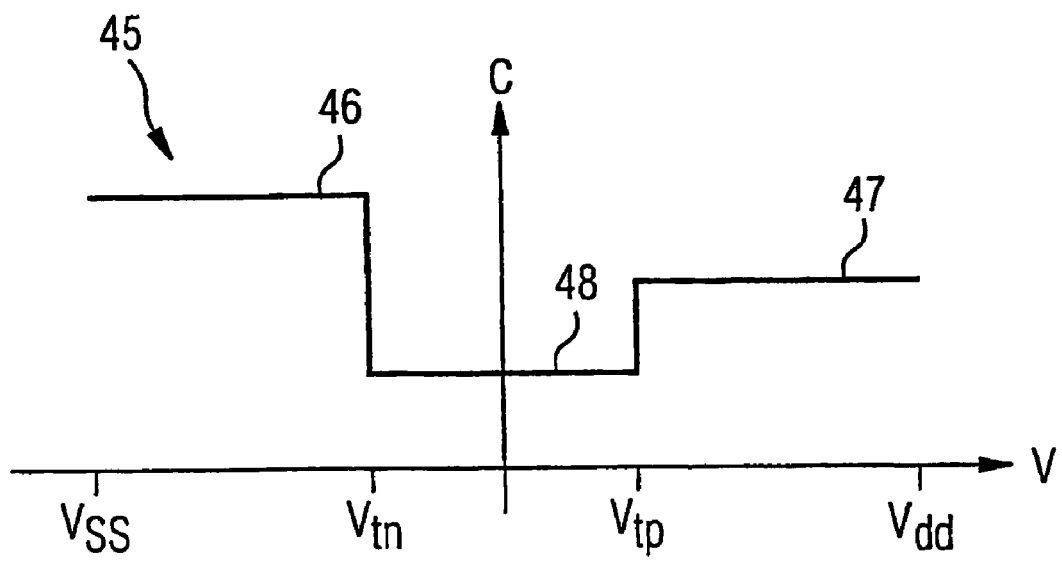
FIG. 5 shows a diagram illustrating the capacitance profile of the feedback capacitor in accordance with FIG. 4 as a function of the applied voltage.

FIG. 5 illustrates the qualitative capacitance profile 45 of the feedback capacitor 41 in the design in accordance with FIG. 4. In this case, it is assumed that the input node 51 is at approximately half the operating voltage potential (Vdd/2). In the regions 46; 47 of higher capacitance, in each case one of the transistors 43, 44 is in inversion. In the present exemplary embodiment, the PMOS transistor 43 is in inversion in the region 46 of the capacitance profile 45, while the NMOS transistor 44 is in inversion in the region 47. In the central region 48 of the capacitance profile 45, the capacitor voltage lies below the respective threshold voltages Vtn and Vtp of the transistors 43, 44, so that only overlap capacitances contribute to the total capacitance.

The input node 51 of the evaluation circuit 50 is designed as a low-impedance node and is at a fixed potential in the present case. The evaluation circuit 50, designed as an amplifier circuit, is furthermore connected to the sub-drivers 20, 30 and the input node 11 for the input signal 13.

FIG. 3 illustrates a detailed circuit diagram of the driver circuit 10 in accordance with FIG. 1. In this case, the individual transistors have been dimensioned in a specific manner, in order to enable a subsequent simulation, the results of which are illustrated in FIGS. 6 and 7.

As can be seen from FIG. 3, the evaluation circuit designed as an amplifier circuit consists of a series of transistors 52 to 57, by means of which the desired gain factor is set. The two sub-drivers 20, 30 are each constructed identically and each have a transistor 22, 32 which operates as current source and functions as a so-called pre-driver. Furthermore, an actual driver transistor 21, 31 is provided in each case. The transistors 21, 31 have a large width in order to be able to realize the driver strength. Furthermore, the two sub-drivers 20, 30 are provided with a switch formed by a transistor 23, 33. Finally, another two transistors 24, 34 are provided, which have the function of control transistors. The control transistors 24, 34 are connected to the amplifier circuit 50.

The method of operation of the driver circuit 10 will now be described below.

The great improvement in the electromagnetic compatibility (EMC) of integrated circuits can be achieved if the driver circuit 10 for pads, busses or the like supplies a charging/discharging current to the load capacitance 15 during the switching edges, which current has the least harmonics possible and is, in particular $\sin^2$-shaped. Furthermore, the driver circuit 10 is intended to have an edge steepness that is independent of the present load situation, in order to further improve the EMC especially for small loads.

The driver circuit 10 illustrated in FIGS. 1 and 3 unites the property of supplying a $\sin^2$-shaped current with an edge steepness that is independent of the present load 15.

In order to obtain the $\sin^2$-shaped current, the two transistors 22, 32 operate as current sources. The embodiment of the pre-driver transistors 22, 32 as current sources and the targeted utilization of the parasitic gate-drain capacitance of the driver transistors 21, 31 enables the charging current profile to be shaped favorably in respect of EMC ($\sin^2$-shaped).

The load independence is achieved by measuring the edge steepness and correspondingly adapting the driver strength in real time or progressively. For the measurement, use is made of the feedback capacitor 41 connected between the output node 12 of the driver circuit 10 and the input node 51 of the amplifier circuit 50. Since the input node 51 is designed as a low-impedance node, a small current is coupled into the amplifier circuit 50 by the feedback capacitor 41 and is correspondingly evaluated in said amplifier circuit. The output signal of the amplifier circuit 50 serves for actuating the control transistors 24, 34, which suitably readjust, for example reduce, the strength of the pre-driver transistors 22, 32.

In particular, the use of a nonlinear feedback capacitance 41 makes it possible to perform targeted shaping of the edges of the output characteristic curve of the driver circuit. The displacement current supplied by the feedback capacitor 41 is compared with a reference current in the amplifier circuit 50. This evaluation is used to set the driver strength in the two sub-drivers 20, 30 in such a way that the same displacement current always occurs in the feedback capacitor 41. The current profile thus realized has a very favorable interference behavior from an EMC standpoint.

Consequently, the basic concept of the driver circuit 10 according to the invention is that the output characteristic of the driver circuit 10 can be directly measured and evaluated, and that the driver strength can thereby be adapted correspondingly. As a result, rise/fall times that are largely independent of the output load 15 are achieved. This means, in particular, that even temporary interference, such as, for example, the in-antiphase switching of adjacent, capacitively coupled lines or the like, does not influence the edge steepness.

The possibility of achieving largely load-independent rise and fall times with the driver circuit 10 according to the invention is illustrated with regard to FIGS. 6 and 7. The two FIGS. 6 and 7 in each case show voltage profiles over time which were simulated in a driver circuit 10 specified in accordance with FIG. 3.

FIG. 6 shows the voltage profiles for different loads for a driver circuit 10 in accordance with the present invention which is provided with a feedback circuit 40. Curve 70 shows the voltage profile for a large load capacitance of 50 pF. As revealed by the illustration, the voltage profile has rise edges 71 and fall edges 72, the rise time being approximately 10 ns. The fall time is approximately the same length. In this exemplary embodiment, rise time is understood to be that period of time which is required by a voltage signal in order to pass from 10% of the operating voltage (0.25 V) to 90% of the operating voltage (2.25 V). Conversely, fall time is understood to be that period of time which is required by a voltage signal in order to pass from 90% of the operating voltage to 10% of the operating voltage.

Curve 73 shows the voltage profile for a small load capacitance of 5 pF. As can be seen from FIG. 6, the voltage profile has rise edges 74 and fall edges 75, the rise time and the fall time being approximately 8 ns.

FIG. 6 thus makes it clear that essentially load-independent voltage profiles can be achieved by using the driver circuit 10 according to the invention.

In contrast to FIG. 6, FIG. 7 illustrates the voltage profile for a large and a small load for a driver circuit 10 which is not provided with a feedback circuit 40, that is to say in which only an approximately $\sin^2$-shaped current is made available, without setting a load-independent edge steepness.

The voltage profile 70 with the respective rise edges 71 and fall edges 72 again corresponds to a large load of 50 pF, while the voltage profile 73 with the corresponding rise edges 74 and fall edges 75 corresponds to a small load of 5 pF.

As can clearly be seen from FIG. 7, there are large differences in the rise times and fall times of the individual voltage profiles. In the case of the large load of 50 pF, the rise time is approximately 10 ns, while the rise time is only approximately 4 ns in the case of the small load. This means that, in this case, the individual voltage profiles and thus the driver circuit 10 do not exhibit load independence.

Finally, FIG. 2 illustrates a further embodiment of a driver circuit 10. Identical components to those in the driver circuit 10 in accordance with FIG. 1 have been provided with identical reference numerals.

The driver circuit 10 again has an input node 11 for an input signal 13 and also an output node 12 for an output signal 14, the output signal 14 being coupled out at the output node 12 and being made available to a load capacitance. The driver circuit 10 again has a pull-up sub-driver 20 and a pull-down sub-driver 30. The two sub-drivers 20, 30 are connected to the input node 11.

In contrast to FIG. 1, in the case of the driver circuit 10 in accordance with FIG. 2, a feedback circuit 40 is provided which has two evaluation circuits 50, 60, in each case one of the evaluation circuits 50, or 60, being connected to a sub-driver 20, or 30, respectively. Each of the evaluation devices 50, 60 is connected to the input node 11, via which the input signal 13 can be coupled in.

Furthermore, a total of two feedback capacitors 41, 42 are provided. Each of these capacitors 41, 42 is arranged in a connecting line leading from the output node 12 to a respective input node 51, 61 of the evaluation devices 50, 60.

The construction of the sub-drivers 20, 30 corresponds to the construction of the sub-drivers from FIG. 3. Equally, the method of operation of the driver circuit 10 corresponds to the method of operation of the driver circuit according to FIGS. 1 and 3, so that, to avoid repetition, a renewed description is dispensed with and, instead of this, the above explanations are hereby incorporated by reference in their entirety.

What is claimed is:

1. A driver circuit, having at least one input node for an input signal and at least one output node for an output signal, having one or more, preferably two, subdrivers, and having a feedback circuit, which has one or more evaluation circuits and one or more feedback capacitors, the evaluation circuits being connected to the subdrivers and the feedback capacitors respectively being provided between the at least one output node of the driver circuit and an input node of the evaluation circuit, the at least one evaluation circuit having a first inverter stage, coupled to the input node of the evaluation circuit, and a second inverter stage, coupled with the first inverter stage, the first inverter stage comprising at least a first transistor of a first polarity and a first transistor of a second polarity, the second polarity being different from the first polarity, wherein the control terminal of the first transistor of the first polarity and the control terminal of the first transistor of the second polarity are coupled to the input node of the evaluation circuit, wherein a second terminal of the first transistor of the first polarity and a second terminal of the first transistor of the second polarity are coupled to each other and to the input node of the evaluation circuit, wherein the second inverter stage comprises at least a second transistor of the first polarity and a second transistor of the second polarity, and wherein a second terminal of the second transistor of the first polarity and a second terminal of the second transistor of the second polarity are coupled to each other and to the subdrivers, wherein a low-harmonics current is generated in the driver circuit and supplied to a load, and wherein an edge steepness that is independent of the present load situation is set in the driver circuit.

2. The driver circuit as claimed in claim 1, wherein the at least one input node for the input signal is connected to the at least one sub-driver.

3. The driver circuit as claimed in claim 1, wherein at least one subdriver and at least one evaluation circuit is provided, each sub-driver being connected to an evaluation circuit.

4. The driver circuit is claimed in claim 3, wherein at least one feedback capacitor is provided, each feedback capacitor being provided between the output node of the driver circuit and the input node of an evaluation circuit.

5. The driver circuit as claimed in claim 1, wherein the input nodes of the evaluation circuits are at low input impedance.

6. The driver circuit as claimed in claim 1, wherein the at least one sub-driver has one or more transistors.

7. The driver circuit as claimed in claim 1, wherein at least one control transistor is provided in the at least one subdriver, said transistor being connected to an evaluation circuit.

8. The driver circuit as claimed in claim 1, wherein the at least one feedback capacitor is designed as a linear capacitor.

9. The driver circuit as claimed in claim 1, wherein the at least one feedback capacitor is designed as a nonlinear capacitor.

10. The driver circuit as claimed in claim 9, wherein the nonlinear capacitor is formed from at least one PMOS transistor and/or at least one NMOS transistor.

11. The driver circuit as in claim 1 wherein a low-harmonics current is generated in the driver circuit and supplied to a load, and wherein an edge steepness that is independent of the present load situation is set in the driver circuit.

12. The driver circuit as in claim 11, wherein a $\sin^2$-shaped current is supplied to the load.

13. The driver circuit as in claim 11 wherein, in order to set the load-independent edge steepness, the output characteristic of the driver circuit is measured by the feedback circuit and evaluated therein, and wherein the driver strength of the at least one sub-driver is regulated on a basis of the evaluation results.

14. The use of a driver circuit as in claim 1 to improve the electromagnetic compatibility of electronic components, in particular of integrated circuits, wherein a low-harmonics current is generated in the driver circuit and supplied to a load and wherein an edge steepness that is independent of the present load situation is set in the driver circuit.

15. The driver circuit as in claim 11 to improve the electromagnetic compatibility of electronic components, in particular of integrated circuits, wherein a $\sin^2$-shaped current is supplied to the load.

* * * * *